United States Patent
Nam et al.

[11] Patent Number: 5,938,852
[45] Date of Patent: Aug. 17, 1999

[54] CAP FOR VERTICAL FURNACE

[75] Inventors: Ki-hum Nam; Hyeog-joon Ko; O-yeon Han; Yu-geun Kim, all of Suwon, Rep. of Korea

[73] Assignee: Samsung Electronics Co., Ltd., Suwon, Rep. of Korea

[21] Appl. No.: 08/825,226

[22] Filed: Mar. 19, 1997

[30] Foreign Application Priority Data

May 17, 1996 [KR] Rep. of Korea ............. 96-16738

[51] Int. Cl.$^6$ .............. C23C 16/00; F27D 3/12; F27D 1/14
[52] U.S. Cl. ............. 118/724; 118/725; 432/241; 432/250
[58] Field of Search ................. 118/724, 725; 432/241, 250

[56] References Cited

U.S. PATENT DOCUMENTS

| | | | |
|---|---|---|---|
| 5,048,800 | 9/1991 | Miyazaki et al. | 266/256 |
| 5,127,365 | 7/1992 | Koyama et al. | 118/724 |
| 5,224,999 | 7/1993 | Shiraiwa et al. | 118/724 |
| 5,308,955 | 5/1994 | Watanabe | 219/390 |
| 5,312,245 | 5/1994 | Brannen et al. | 432/95 |
| 5,320,680 | 6/1994 | Learn et al. | 118/724 |
| 5,370,371 | 12/1994 | Miyagi et al. | 266/256 |
| 5,421,892 | 6/1995 | Miyagi | 118/724 |
| 5,443,648 | 8/1995 | Ohkase | 118/724 |
| 5,458,688 | 10/1995 | Watanabe | 118/724 |
| 5,480,300 | 1/1996 | Okoshi et al. | 432/241 |
| 5,540,782 | 7/1996 | Miyagi et al. | 118/724 |
| 5,709,543 | 1/1998 | Shimazu | 432/241 |

FOREIGN PATENT DOCUMENTS 63-136529 6/1988 Japan .

Primary Examiner—Bruce Breneman
Assistant Examiner—Jeffrie R Lund
Attorney, Agent, or Firm—Jones Volentine, L.L.P.

[57] ABSTRACT

A cap for a vertical furnace includes a first flat plate and a second flat plate separated by a predetermined distance, and a plurality of support rods connecting the first and second flat plates. A plurality of adjacent and horizontally disposed adiabatic plates are vertically stacked between the first and the second flat plates such that edges of the adiabatic plates contact the support rods. The first and second flat plates, adjacent adiabatic plates, and the plurality of support rods are integrally formed in a single structure. Since all the components of the cap are formed in single structure, installation and replacement is simplified and the generation of contamination particles is prevented since no parts need to be repeatedly assembled and disassembled.

9 Claims, 6 Drawing Sheets

CAP FOR VERTICAL FURNACE

BACKGROUND OF THE INVENTION

1. Field of the Invention

The present invention relates to a vertical furnace used in the fabrication of semiconductor devices, and more particularly, to a single bodied cap for a vertical furnace which supports a semiconductor wafer boat and maintains an appropriate temperature in the vertical furnace.

2. Description of the Related Art

Various films, such as polysilicon, oxide, and nitride films, are formed in a furnace in order to manufacture semiconductor devices. The furnace should be extremely stable and have a high degree durability since combustible poisonous gases are used at high temperatures to form the various films therein. The furnace should also prohibit the generation of contaminating particles, and the parts of the furnace should be easily changeable after installation of the furnace.

In particular, since the cap for supporting the boat on which wafers are loaded is also the portion through which reactive gases are initially passed, the cap itself should not contain any contaminating particles, should be durable, and should be easy to assemble and replace.

FIG. 1 is a perspective view of a furnace in which a conventional cap is used. FIG. 2 is an exploded perspective view of the main portions of the furnace of FIG. 1. Referring to FIGS. 1 and 2, the furnace comprises a cap 12, a holder 18, and a base 20 on which the cap 12 is mounted. A boat 10, into which wafers 11 are placed, is composed of two parallel circular plates 10b and 10c connected by a plurality of supporting rods 10a, and two connection holes 10d formed in the lower circular plate 10c for connecting the boat 10 to the cap 12.

The cap 12 supports the boat 10 and has a cylindrical structure having an open bottom. At the upper surface of the cap 12, screw holes 12a are formed, corresponding to the connection holes 10d of the lower circular plate 10c. The boat 10 and the cap 12 are connected via screws 14 through the connection holes 10d and screw holes 12a.

The holder 18, within which a plurality of adiabatic plates 16 are stacked side by side, has a similar structure to that of the boat 10 and fits inside the cap 12 after the adiabatic plates 16 have been placed therein. A through hole 18b for connecting the holder to the base 20 is formed in the lower circular plate 18a of the holder 18. The adiabatic plates 16 maintain a uniform temperature inside the heat treatment tube 24.

The base 20 comprises a flanged supporting portion 20b, a projecting portion 20a at the center of the flanged supporting portion 20b for connecting the base 20 to the holder 18, and a tube supporting portion 20c, having a diameter larger than that of the heat treatment tube 24, to support the heat treatment tube 24 placed thereon.

The tube supporting portion is connected to an elevating means 22. The elevating means 22 is, for example, a hydraulic jack, for raising the boat 10 into the heat treatment tube 24.

In the conventional vertical furnace described above, the means for supporting the boat 10 and maintaining an appropriate temperature for the reaction of gases comprises three main parts, i.e., the cap 12, the holder 18, and the adiabatic plates 16. Since the respective parts are formed of quartz, however, the friction generated among the respective parts during the assembly process may cause a crack or destroy any one of the parts. In addition, the fine quartz powder generated during the assembly process may become a contaminant during subsequent diffusion or deposition manufacturing processes.

Another disadvantage is that since the cap 12 is tightly closed, some of the reactive gases supplied to the inside of the heat treatment tube 24 rise along the narrow spaces between the cap 12 and the heat treatment tube 24 and reach the lower portion of the boat 10, forming an open space. Other reactive gases that rise rapidly flow to the upper portion of the boat 10, forming a vortex by spreading rapidly into the open space of the lower portion of the boat.

Thus, the flow of the reactive gases on the surfaces of the wafers is not uniform and will vary depending on the respective positions of the wafers inside the boat 10. Also, non-activated gases can act as contaminating particles on the wafers. Such problems are more severe at the lower portions of the boat.

Moreover, there are many problems in maintaining the parts of the furnace since the durability of the respective parts will vary and the procedures for replacing the parts are complicated.

SUMMARY OF THE INVENTION

It is an object of the present invention to provide a single bodied cap for a vertical furnace which supports a boat and maintains an appropriate temperature in the vertical furnace.

To achieve these and other objects, there is provided a cap for a vertical furnace, comprising: a first flat plate; a second flat plate parallel to the first flat plate and separated therefrom by a first predetermined distance; a plurality of support rods connecting the first flat plate to the second flat plate; and a plurality of adjacent and horizontally disposed adiabatic plates that are vertically stacked between the first and the second flat plates such that edges of the adiabatic plates contact the support rods, the adjacent adiabatic plates being separated by a second predetermined distance, wherein the first and the second flat plates, the adjacent adiabatic plates, and the plurality of support rods are integrally formed in a single structure.

It is preferable that the respective adjacent adiabatic plates have a plurality of openings formed therein, and further, that the openings are offset from the next adjacent adiabatic plate.

In another embodiment, it is preferable that the adiabatic plates are configured with a hollow central portion that is maintained in a vacuum state.

The first flat plate may have screw holes formed therethrough, or projecting portions on an upper surface, for connection to a wafer boat. The second flat plate may have a central opening formed therethrough, or a central groove formed at a lower surface, for connection to a base support member.

The first and the second flat plates, the adiabatic plates, and the support rods are each respectively formed of quartz or SiC.

In the cap for the vertical furnace described above, the parts for supporting the boat and maintaining an appropriate temperature are encompassed in one body. Therefore, since assembly of the respective parts is not required, the conventional problem of instability due to contaminating particles being generated in the assembly process is avoided, and the installation, management, and replacement of the device is simplified.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, preferred embodiments of a cap for a furnace according to the present invention will be described in detail with reference to FIGS. 3 through 9.

Figure 4:
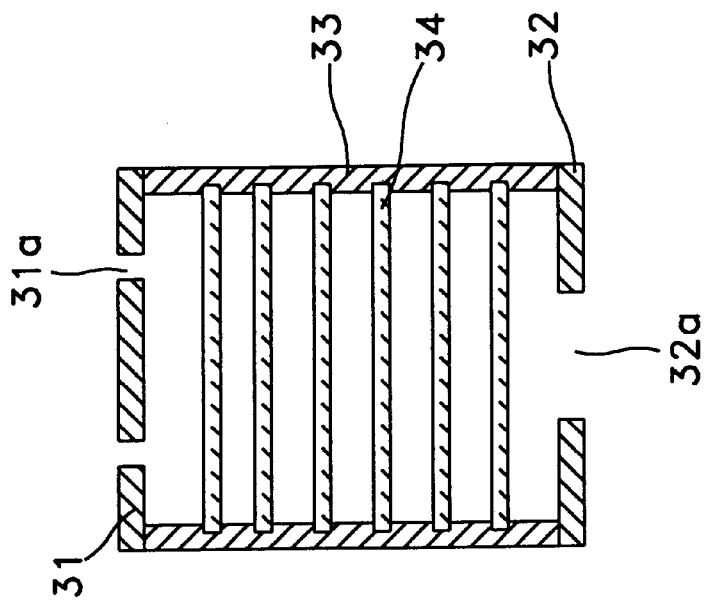
FIG. 4 is a sectional view taken along the IV—IV line of FIG. 3.
Figure 3:
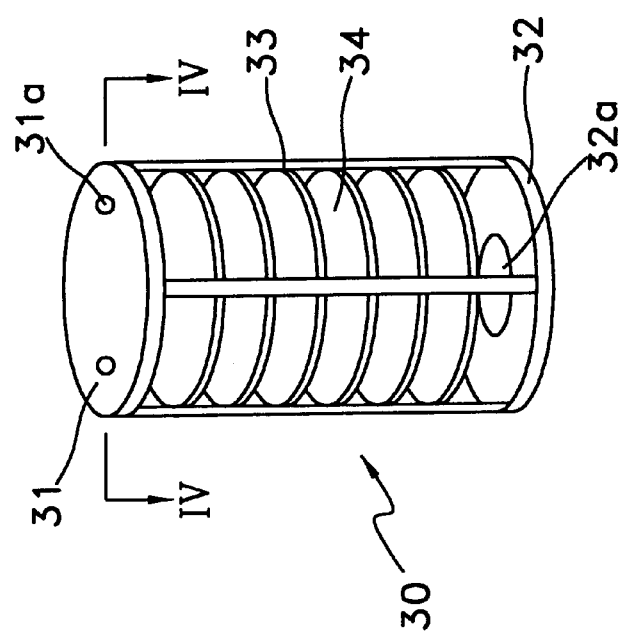
FIG. 3 is a perspective view of the cap for the vertical furnace according to an embodiment of the present invention.

FIG. 3 is a perspective view of a cap 30 according to a preferred embodiment of the present invention and FIG. 4 is a sectional view taken along the IV—IV line of FIG. 3. Referring to FIGS. 3 and 4, the cap 30 comprises an upper flat plate 31 and a lower flat plate 32, where the upper and lower flat plates 31 and 32 are connected by a plurality of support rods 33. The cap 30 has a plurality of adiabatic plates 34, stacked parallel in a side by side vertical orientation. The adiabatic plates 34 are spaced at equidistant intervals, and the edges of the adiabatic plates 34 contact the support rods 33. The upper flat plate 31 connects to a wafer boat 10 (see FIG. 9) and the lower flat plate 32 connects to a supporting portion 20b (see FIG. 9) of a base 20. The upper flat plate 31, the lower flat plate 32, the support rods 33, and the adiabatic plates 34 are connected to form a single body or single structure and are preferably formed of quartz or SiC.

Figure 9:
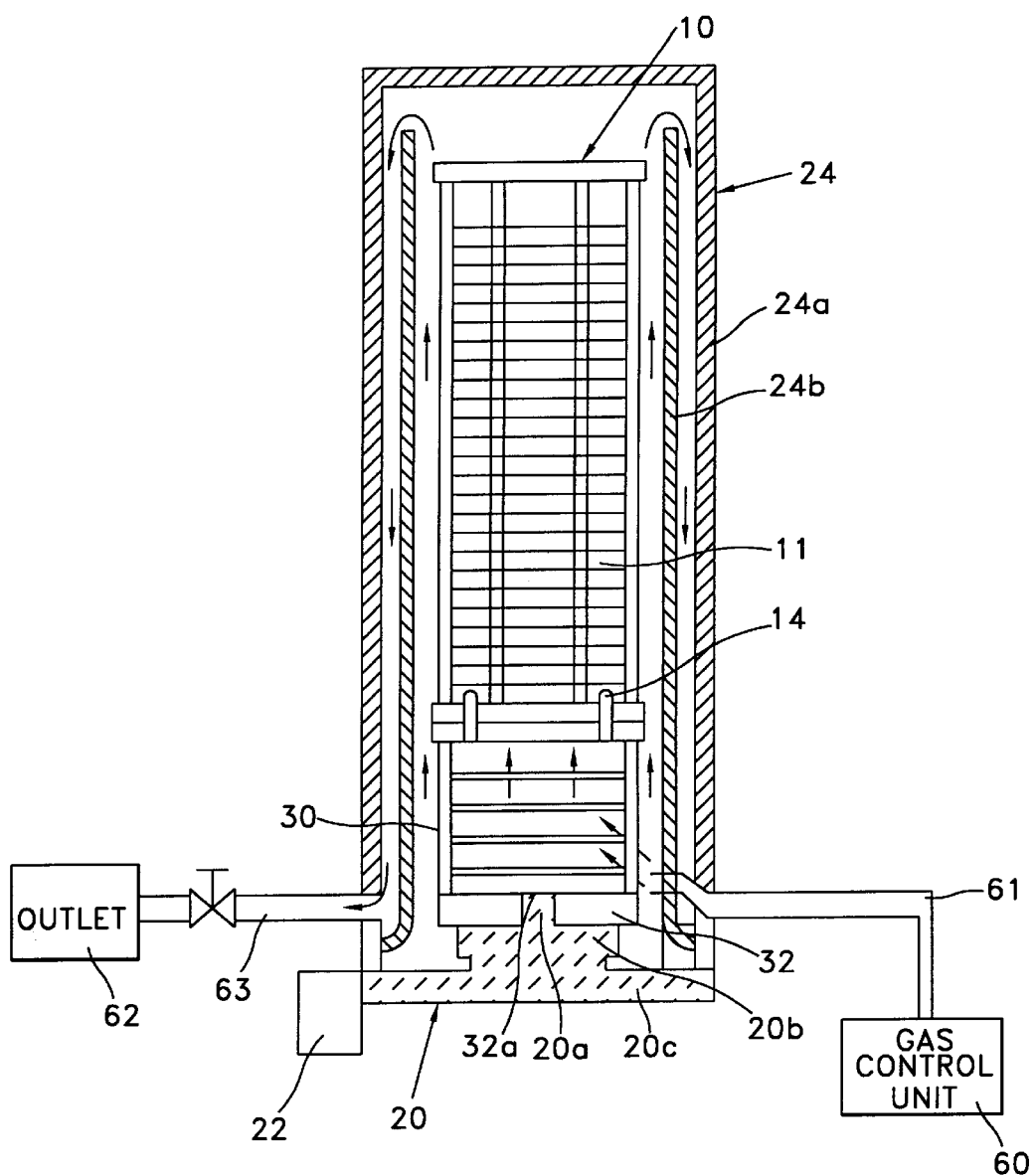
FIG. 9 is a schematic sectional diagram of the vertical furnace in which the cap of FIG. 3 is installed.

As shown in FIG. 3, in the upper flat plate 31, two screw holes 31a are preferably formed for connecting the upper flat plate 31 to the boat 10 with screws 14 (see FIG. 9). In the lower flat plate 32, a central opening 32a is formed for connecting the cap 30 to the projecting portion 20a (see FIG. 9) of the base 20.

According to the above embodiment, the cap 30 of the present invention does not need to be assembled since the cap 30 is comprised of a single body, unlike the conventional cap. Therefore, no contamination particles are generated due to the friction caused during assembly, and the single structure cap is easily installed and replaced.

Figure 5:
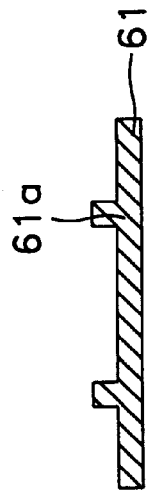
FIG. 5 is a sectional view of an alternate embodiment of the lower flat plate of the present invention.

FIG. 5 is a sectional view showing another embodiment of the lower flat plate 52 of the cap 30 according to the present invention. The lower flat plate 52 shown in FIG. 5 is different from the lower flat plate 32 shown in FIG. 4 in that a groove 52a is formed along the lower surface of the plate 32, instead of the central opening 32a, for connecting the cap 30 to the projecting portion 20a of the base 20. Since the groove 52a is formed instead of the central opening 32a, the intrusion of contaminants inside the cap 30 from the base 20 through the central opening 32a of the lower flat plate 32 is prevented during the formation of the vapor deposition film.

Figure 6:
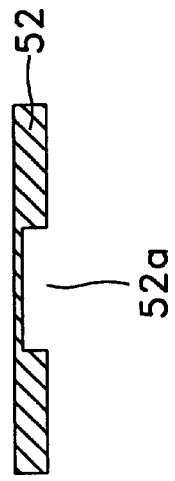
FIG. 6 is a sectional view of an alternate embodiment of the upper flat plate of the present invention.

FIG. 6 is a sectional view of an upper flat plate 61 for the cap 30 according to another embodiment of the present invention. Rather than having screw holes 31a (see FIG. 4), the upper flat plate 61 shown in FIG. 6 has two projecting portion 61a for connecting the upper flat plate 61 to the boat 10. Since the projecting portion 61a are directly inserted into the connection holes 10d of the boat 10, screws 14 are not required and the assembly is simplified. Also, contamination particles generated in the process of driving the screws 14 are eliminated.

Figure 7:
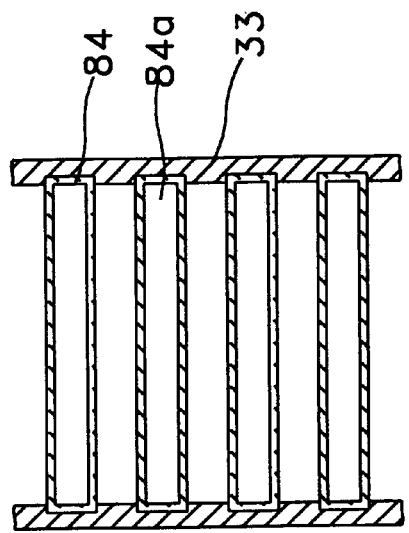
FIG. 7 is a sectional view of an alternate embodiment of the adiabatic plates of the present invention.

FIG. 7 is a partial sectional view showing another embodiment of the adiabatic plates residing in the cap 30 according to the present invention. The adiabatic plates 74 shown in FIG. 7 have a plurality of openings 74a formed therein. In particular, the openings 74a of the adiabatic plates 74 are arranged so that openings 74a of adjacent plates are offset from each other. By forming the openings 74a in the adiabatic plates 74 in such a manner, the heat flows through the cap and the furnace easily.

Figure 8:
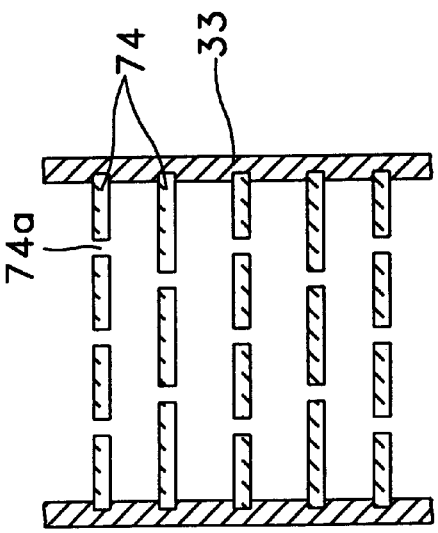
FIG. 8 is a sectional view of an another alternate embodiment of the adiabatic plates of the present invention.

FIG. 8 is a sectional view illustrating the adiabatic plates of the cap 30 according to still another embodiment of the present invention. The adiabatic plates 84 of FIG. 8 have hollow central portions 84a that are maintained in a vacuum state. Due to these inner vacuum spaces 84a, the temperature between the adiabatic plates 84 can be kept uniform to maximize the adiabatic effect of the cap 30.

FIG. 9 is a sectional view of the vertical furnace in which the cap 30 of FIG. 3 is installed. As shown in FIG. 9, the heat treatment tube 24 is comprised of two tubes, i.e., the outer tube 24a and the inner tube 24b. The opening of the outer tube 24a fits on the tube supporting portion 20c of the base 20. The outer tube 24a of the heat treatment tube 24 contacts and seals to the tube supporting portion 20c to prevent gases from escaping. The cap 30 is placed on the supporting portion 20b of the base 20 inside the heat treatment tube 24. The boat 10, into which wafers 11 are loaded, is placed on the cap 30. A gas supply pipe 61 from a gas control unit 60, and an exhaust pipe 63 connected to an outlet 62, are respectively connected to the heat treatment tube 24.

The operation of the furnace will be described with reference to FIG. 9. The cap 30 and the boat 10 are lifted into a predetermined position inside the heat treatment tube 24 by the operation of the elevating means 22 which is connected to the base 20. Thus, the lower rim of the outer tube 24a opening contacts the tube supporting portion 20c of the base.

Then, reactive gases for forming the vapor deposition film are supplied from the gas control unit 60 to the inside of the heat treatment tube 24 through the gas supply pipe 61. The gases flow around the surfaces of the wafers 11 loaded in the boat 10 as indicated by the direction of the arrows in FIG. 9, thereby forming the vapor deposition film on the wafer 11.

Since the cap 30 has an open structure, such that the flow of gases in and out are facilitated, the gases supplied from the gas supply pipe 61 pass through the inside of the cap 30. Therefore, the reactive gases reach the surfaces of the wafers 11 in the boat 10 after activation of the gases has been accomplished, thereby reducing the number of contamination particles generated, and the vapor deposition film is uniformly formed on the surfaces of the wafers 11 regardless of the position of the wafer 11 in the boat 10. In effect, the cap 30 performs a function similar to that of using dummy wafers.

Figure 1:
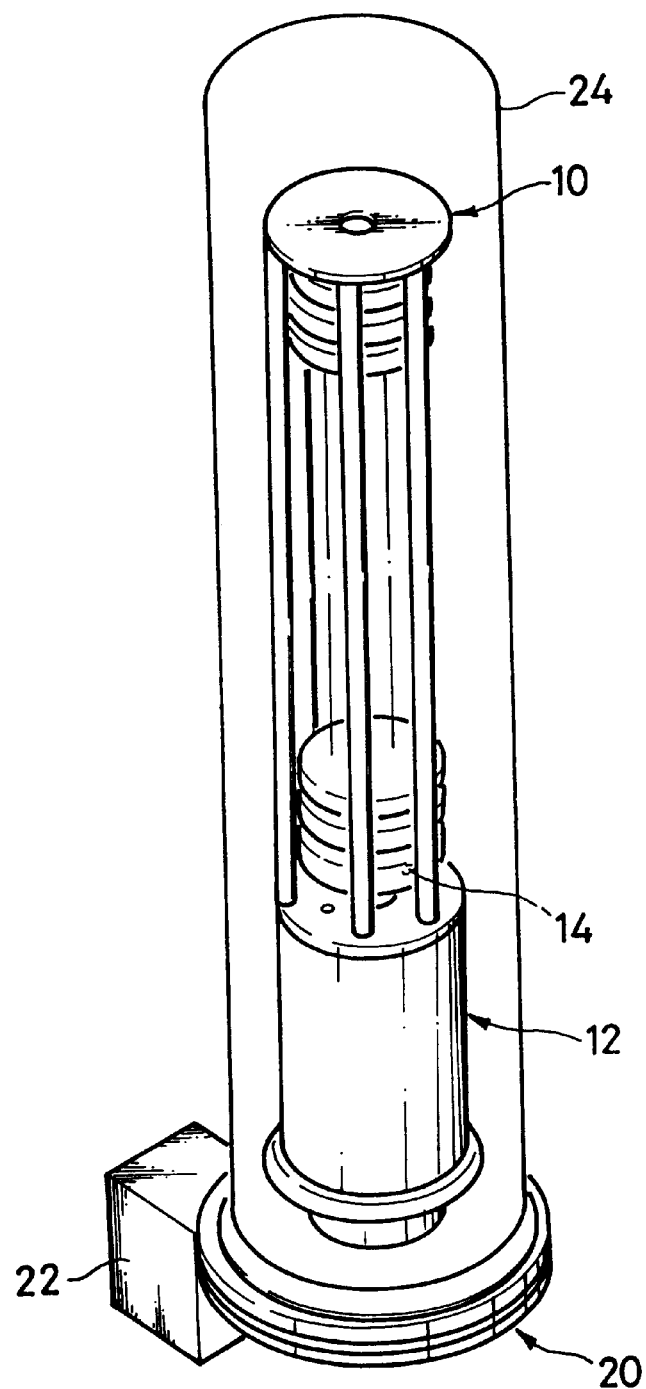
FIG. 1 is a perspective view of a vertical furnace in which a conventional cap is used.
Figure 2:
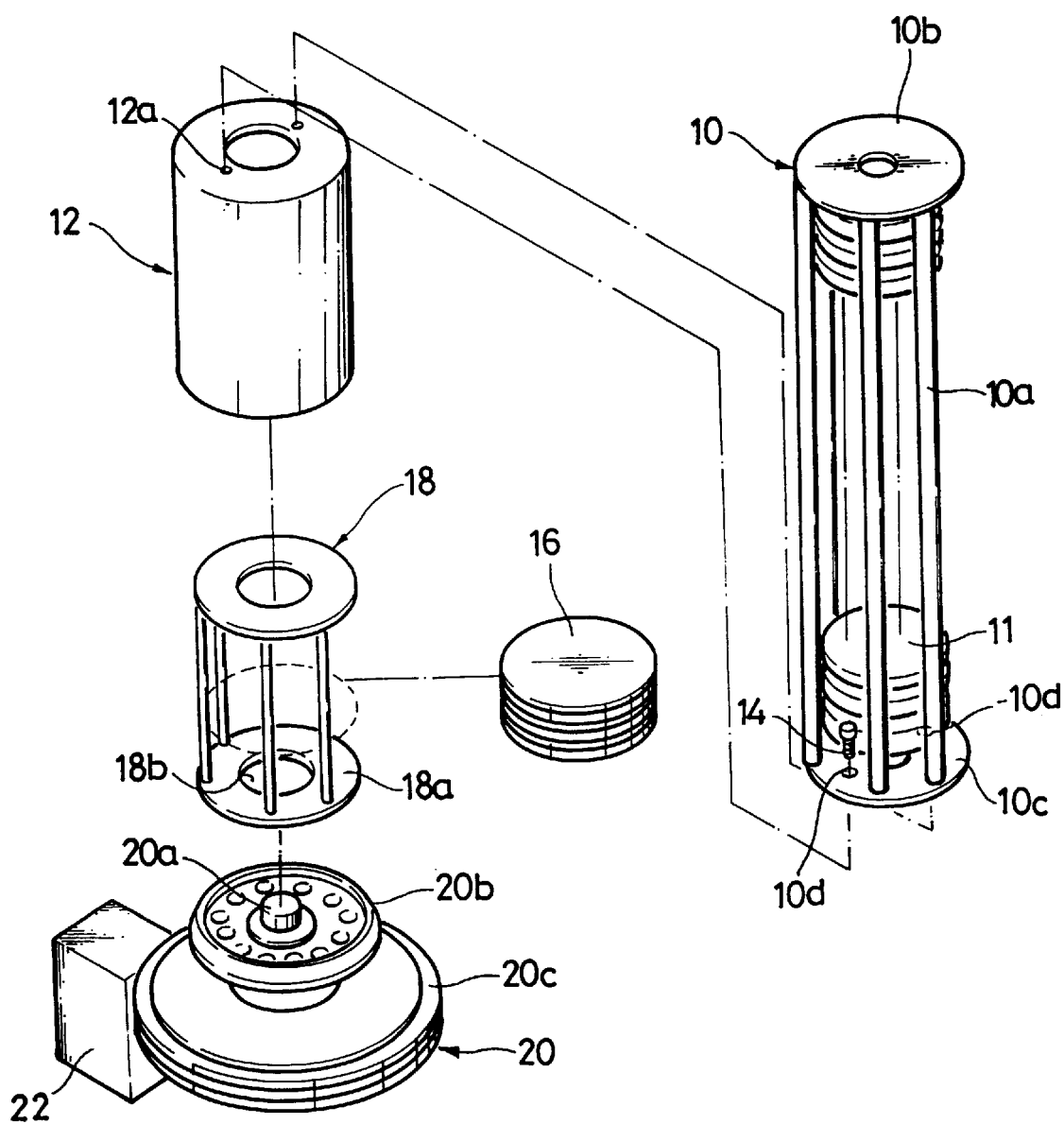
FIG. 2 is an exploded perspective view of the main portions of the vertical furnace shown in FIG. 1.

To measure the effects of using the cap 30 according to the present invention, the number of contamination particles generated at three sections of the boat 10, i.e., an upper portion, a middle portion, and a lower portion, are shown in Table 1, after forming a nitride film ($Si_3N_4$) to a thickness of 1500 Å in the furnace as shown in FIG. 9. To compare the results of using the cap 30 of the present invention with that of the conventional cap, the number of the contamination particles generated in the furnace as shown in FIG. 1 under the same experiments conditions were measured.

Figure 10:
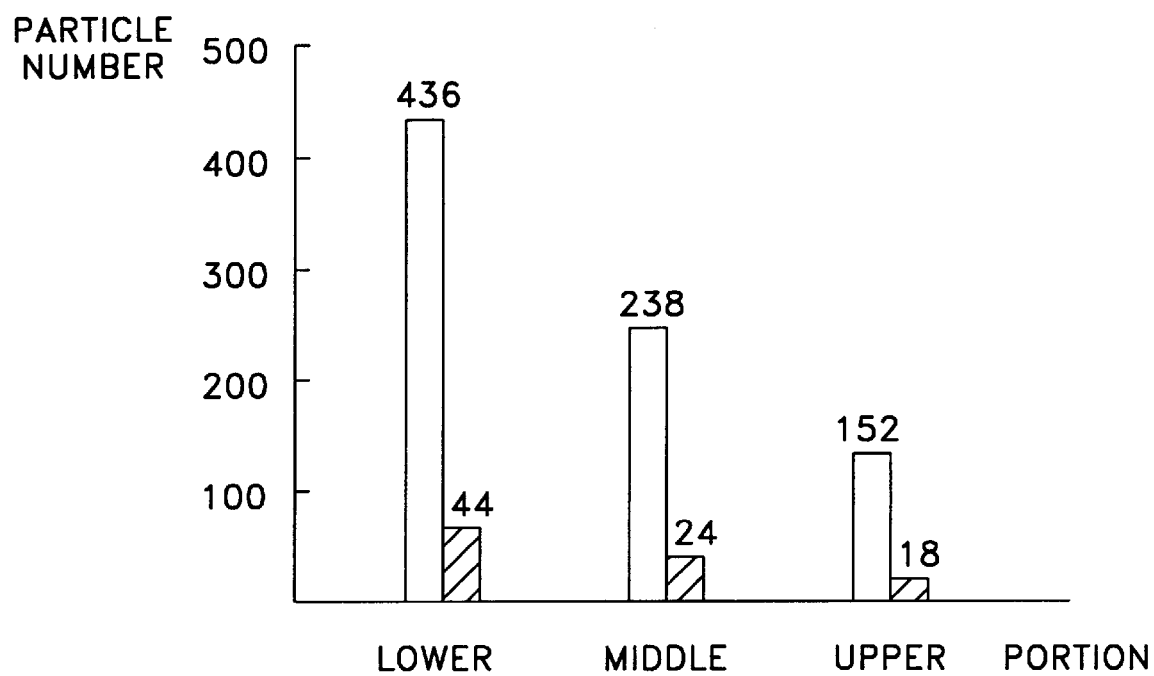
FIG. 10 is a bar graph comparing the number of the contamination particles generated in a vapor deposition film formed in a vertical furnace having the cap according to the present invention installed, with the number of the contamination particles generated in a vapor deposition film formed in a vertical furnace having a conventional cap installed.

FIG. 10 is a bar graph comparing the average number of contamination particles generated in a vapor deposition film formed in a vertical furnace having a cap installed according to the present invention (hashed bars), with the average number of the contamination particles generated in a vapor deposition film formed in a vertical furnace having a conventional cap installed (clear bars).

TABLE 1

Number of Contamination Particles

| Experiment No. | Number of contamination particles generated using the cap of the present invention | | | Number of contamination particles generated using a conventional cap | | |
|---|---|---|---|---|---|---|
| | Lower Portion | Middle Portion | Upper Portion | Lower Portion | Middle Portion | Upper Portion |
| 1 | 25 | 11 | 12 | 501 | 355 | 39 |
| 2 | 38 | 26 | 15 | 300 | 300 | 76 |
| 3 | 41 | 25 | 18 | 528 | 246 | 416 |
| 4 | 84 | 26 | 12 | 725 | 303 | 210 |
| 5 | 23 | 18 | 7 | 300 | 224 | 105 |
| 6 | 30 | 27 | 15 | 355 | 173 | 232 |
| 7 | 29 | 20 | 17 | 364 | 104 | 89 |
| 8 | 71 | 25 | 19 | 279 | 57 | 89 |
| 9 | 42 | 28 | 41 | 715 | 545 | 139 |
| 10 | 52 | 29 | 27 | 294 | 73 | 121 |
| Average | 44 | 24 | 18 | 436 | 238 | 152 |

As shown in Table 1 and FIG. 10, as a result of using the cap according to the present invention, the number of contamination particles decreases remarkably, compared with the number of contamination particles generated using the conventional cap. Also, the results also suggest that the reactions take place uniformly, regardless of the position of the wafers 11 inside the boat 10.

The single body cap of the present invention has several advantages. First, the cap does not require repeated assembly and disassembly since the parts for supporting the boat and maintaining the temperature are encompassed in one body. Therefore, the operating rate of the furnace is enhanced since time is saved in installing the cap. Also, maintaining and replacing the cap can be accomplished efficiently.

Another advantage is that the operation of the furnace is stabilized using the cap of the present invention since contamination by quartz powders generated by the conventional friction and cracking of the respective parts during the assembly process is prevented. Also, since the cap itself has an open structure in which reactive gases flow easily and are fully activated, the reactive gases flow evenly over the surfaces of the wafers loaded in the boat, thereby allowing a uniform film to be formed.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A cap for a vertical furnace, comprising:

a first flat plate;

a second flat plate parallel to said first flat plate and separated therefrom by a first distance;

a plurality of support rods connecting said first flat plate to said second flat plate; and a plurality of adjacent and horizontally disposed adiabatic plates that are vertically stacked between said first and said second flat plates such that edges of said adiabatic plates contact said support rods, said adjacent adiabatic plates being separated by a second distance, wherein respective of said adjacent adiabatic plates have a plurality of openings formed therein, and wherein said first and said second flat plates, said adjacent adiabatic plates, and said plurality of support rods are integrally formed in a single structure.

2. The cap for a vertical furnace claimed in claim 1, wherein said adjacent adiabatic plates are arranged such that the respective openings of the adjacent adiabatic plates are offset from each other.

3. The cap for a vertical furnace claimed in claim 1, wherein a plurality of screw holes are formed in said first flat plate for attachment to a wafer boat and a central opening is formed in said second flat plate for attachment to a base support member.

4. The cap for a vertical furnace claimed in claim 1, wherein a plurality of screw holes are formed in said first flat plate for attachment to a wafer boat and a central groove is formed at a lower surface of said second flat plate for attachment to a base support member.

5. The cap for a vertical furnace claimed in claim 1, wherein a plurality of projecting portions are formed on an upper surface of said first flat plate for attachment to a wafer boat and a central opening is formed in said second flat plate for attachment to a base support member.

6. The cap for a vertical furnace claimed in claim 1, wherein a plurality of projecting portions are formed on an upper surface of said first flat plate for attachment to a wafer boat and a central groove is formed at a lower surface of said second flat plate for attachment to a base support member.

7. The cap for a vertical furnace claimed in claim 1, wherein said first and said second flat plates, said adjacent adiabatic plates, and said support rods are each formed from one of a group consisting of quartz and SiC.

8. A cap for a vertical furnace, comprising:

a first flat plate;

a second flat plate parallel to said first flat plate and separated therefrom by a first distance;

a plurality of support rods connecting said first flat plate to said second flat plate; and a plurality of adjacent and horizontally disposed adiabatic plates that are vertically stacked between said first and said second flat plates such that edges of said adiabatic plates contact said support rods, said adjacent adiabatic plates being separated by a second distance, wherein respective of said adjacent adiabatic plates have a a hollow central portion, and wherein said first and said second flat plates, said adjacent adiabatic plates, and said plurality of support rods are integrally formed in a single structure.

9. The cap for a vertical furnace claimed in claim 8, wherein said hollow central portion is maintained in a vacuum state.

* * * * *